United States Patent [19]
Rankin et al.

[11] Patent Number: 5,307,006
[45] Date of Patent: Apr. 26, 1994

[54] OPTICAL VOLTAGE REFERENCE

[75] Inventors: Richard Rankin, Ammon; Dale Kotter, Bingham County, both of Id.

[73] Assignee: The United States of America as represented by the United States Department of Energy, Washington, D.C.

[21] Appl. No.: 942,239

[22] Filed: Sep. 9, 1992

[51] Int. Cl.$^5$ ................................................ G05F 3/16
[52] U.S. Cl. ..................................... 323/313; 323/902; 323/303; 307/296.6
[58] Field of Search ............... 323/902, 313, 314, 315, 323/316, 317, 299, 303; 307/296.1, 296.7, 296.6

[56] References Cited

U.S. PATENT DOCUMENTS

| | | | |
|---|---|---|---|
| 3,991,319 | 11/1976 | Servos et al. | 307/64 |
| 4,376,969 | 3/1983 | Bedard et al. | 363/78 |
| 4,395,660 | 7/1983 | Waszkiewicz | 315/291 |

Primary Examiner—Steven L. Stephan
Assistant Examiner—B. Davidson
Attorney, Agent, or Firm—Bradley W. Smith; Hugh Glenn; William R. Moser

[57] ABSTRACT

An optical voltage reference for providing an alternative to a battery source. The optical reference apparatus provides a temperature stable, high precision, isolated voltage reference through the use of optical isolation techniques to eliminate current and impedance coupling errors. Pulse rate frequency modulation is employed to eliminate errors in the optical transmission link while phase-lock feedback is employed to stabilize the frequency to voltage transfer function.

17 Claims, 2 Drawing Sheets

OPTICAL VOLTAGE REFERENCE

CONTRACTUAL ORIGIN OF THE INVENTION

The United States Government has rights in this invention pursuant to Contract No. DE-AC07-84ID12435 between the United States Department of Energy and Westinghouse Idaho Nuclear Company.

BACKGROUND OF THE INVENTION

Battery based voltage references are commonly used in instrumentation that requires a floating reference or offset voltage. Some instruments rely on a battery reference to establish a basis for absolute measurement accuracy. The voltage reference must have high ohmic and impedance isolation from the instrument ground to avoid errors or circuit damage that can occur from ground loops and loading effects.

Alternatives to batteries have been investigated. Solid state voltage sources are available but it is questionable if they can meet the isolation and stability specifications provided by batteries, specifically mercury cells. Solid state isolation methods are typically based on transformer or capacitor coupled technology. Although these methods provide suitable ohmic isolation, they introduce errors from leakage currents and from capacitive impedance coupling. These limitations often cause the designer to rely on battery reference techniques.

Since batteries have a limited service life, it is recognized that they are not the optimal solution. With batteries, high stability is maintained until cutoff is reached; at which point, the voltage output gradually decays. If the battery is not quickly replaced, offset errors are introduced. This can pose a problem since batteries are often embedded in the instrumentation and are inconvenient to monitor and replace. The disposal of used batteries presents an additional problem due to increased costs associated with disposal and potential environmental impacts. Mercury batteries, which are often used because of their high stability, are considered hazardous waste.

Advances in technology have made it possible to design solid-state voltage reference systems suitable to replace batteries. By using optical isolation techniques, it is possible to reduce errors from leakage currents and impedance coupling. Pulse rate frequency modulation is used to eliminate nonlinearities in the optical transmission link which occur from normal age-related intensity changes in the light source. The use of phase-locked loop feedback in the demodulation stage provides a highly stable frequency to voltage transfer function.

Accordingly, it is an object of this invention to provide an alternative to batteries which can deliver the isolation and stability inherent in batteries.

A further object of this invention is to provide a system which employs optical isolation techniques to reduce errors due to current leakages and impedance coupling.

A further object of this invention is to provide for a modulating technique to eliminate nonlinearities in the optical transmission.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentalities and combinations particularly pointed out in the appended claims.

SUMMARY OF THE INVENTION

To achieve the foregoing and other objectives and in accordance with the purposes of the present invention, as embodied and broadly described herein, the present invention provides for an optically coupled, ultra-high precision, isolated voltage reference. By using optical isolation techniques, Applicants' invention provides a voltage reference with greater than $10^{12}$ ohmic isolation, less than 2 picofarads of reactance, and leakage currents of less than 0.25 microamps. Long term stability of 100 ppm or better with 4.5 digits of resolution is obtainable. Temperature impacts are further reduced by housing the optical voltage reference in an insulated enclosure.

DETAILED DESCRIPTION OF THE INVENTION

The subject invention teaches an optical voltage reference system for providing a high ohmic impedance and isolation from the instrument ground. Through the use of optical isolation techniques, the optical voltage reference system provides an ohmic isolation of greater than $10^{12}$, a reactance of less than 2 picofarads, and a leakage current of less than 0.25 microamps. The invention can obtain a long term stability of 100 ppm or better with a 4.5 digit resolution. To provide for temperature stability, the optical voltage reference is housed in an insulated enclosure.

Figure 1:
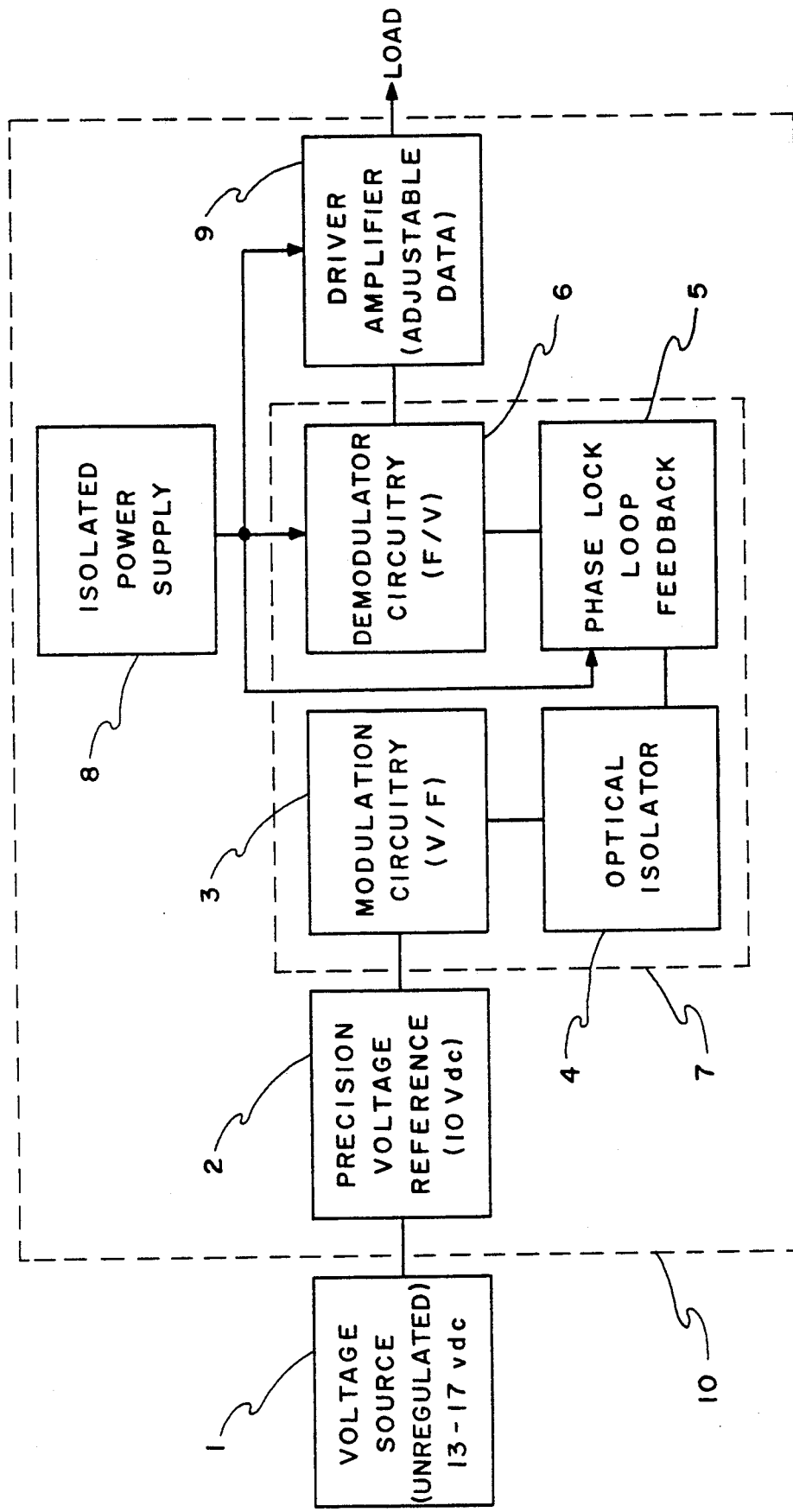
FIG. 1 represents a block diagram of the invention.

FIG. 1 illustrates a block diagram for the optical reference system. An unregulated input voltage 1 is tapped off the low voltage, common ground supply of the instrument in which the optical voltage reference will be installed. The unregulated input voltage 1 is fed into a precision voltage reference integrated circuit 2. The precision voltage reference 2 has an internal temperature compensation to eliminate impacts from temperature variations. A buried zener diode design, in the precision voltage reference 2, incorporates laser trimming of thin-film resistors for excellent accuracy and low drift versus temperature parameters. The output of the precision voltage reference 2 is +10.000 V ±1.0 mV.

A voltage-to-frequency converter 3 is used to convert the analog input voltage from the precision voltage reference 2 into a train of output pulses at a rate directly proportional to the amplitude of the input voltage. This frequency modulated signal is then transmitted to an optically coupled isolator 4. The optically coupled isolator 4 makes it possible to isolate a linear, analog signal. The isolator 4 effectively decouples the analog signal from the instrument ground. By incorporating modulation technology together with feedback principles from radio technology, it is possible to accurately transform voltage to optical signals and back to voltage while maintaining the integrity of the analog signal. High precision is accomplished by using a frequency feedback phase-locked loop system. A crystal controlled phase-locked loop 5 is used to synchronize the modulation frequencies to provide for a more linear transfer function than is possible with standard monolithic voltage-to-frequency converters.

The output of the optical isolator 4 is applied to the crystal controlled phase-locked loop 5. The phase-locked loop 5 employs a crystal oscillator, FIG. 2, 10 to synchronize the modulated signal received from the optical isolator. The signal is then transferred to a frequency-to-voltage converter 6 which demodulates the signal to re-construct the original analog signal. Both the voltage-to-frequency converter 3 and the frequency-to-voltage converter 6 were selected for optimum linearity and temperature stability. Items 3, 4, 5, and 6 make up the optically coupled isolation system 7 with phase-lock loop feedback. Using this system 7, it is possible to reduce errors from leakage currents and impedance coupling. Pulse rate frequency modulation is used to eliminate nonlinearities in the optical transmission link; these nonlinearities result from normal age related intensity changes in the light source. The use of phase-lock loop feedback in the demodulation stage provides a highly stable frequency to voltage transfer function. An isolated DC to DC converter 8 is used to provide dc power for the isolated portions of the frequency demodulation and driver circuitry. Power line isolation of up to 10 Gigohms is maintained. The voltage signal from the frequency to voltage converter 6 is transmitted to the driver amplifier 9. The driver amplifier 9 performs three basic functions: it isolates the demodulation circuitry; it acts as a driver to provide the required load current to an external circuit load; and it provides precision voltage attenuation to an external circuit load to simulate various battery cell voltages.

The apparatus minus the unregulated voltage source 1 is installed in a temperature controlled environment 10 to reduce errors induced by subjecting the components of the apparatus to temperature fluctuations.

Figure 2:
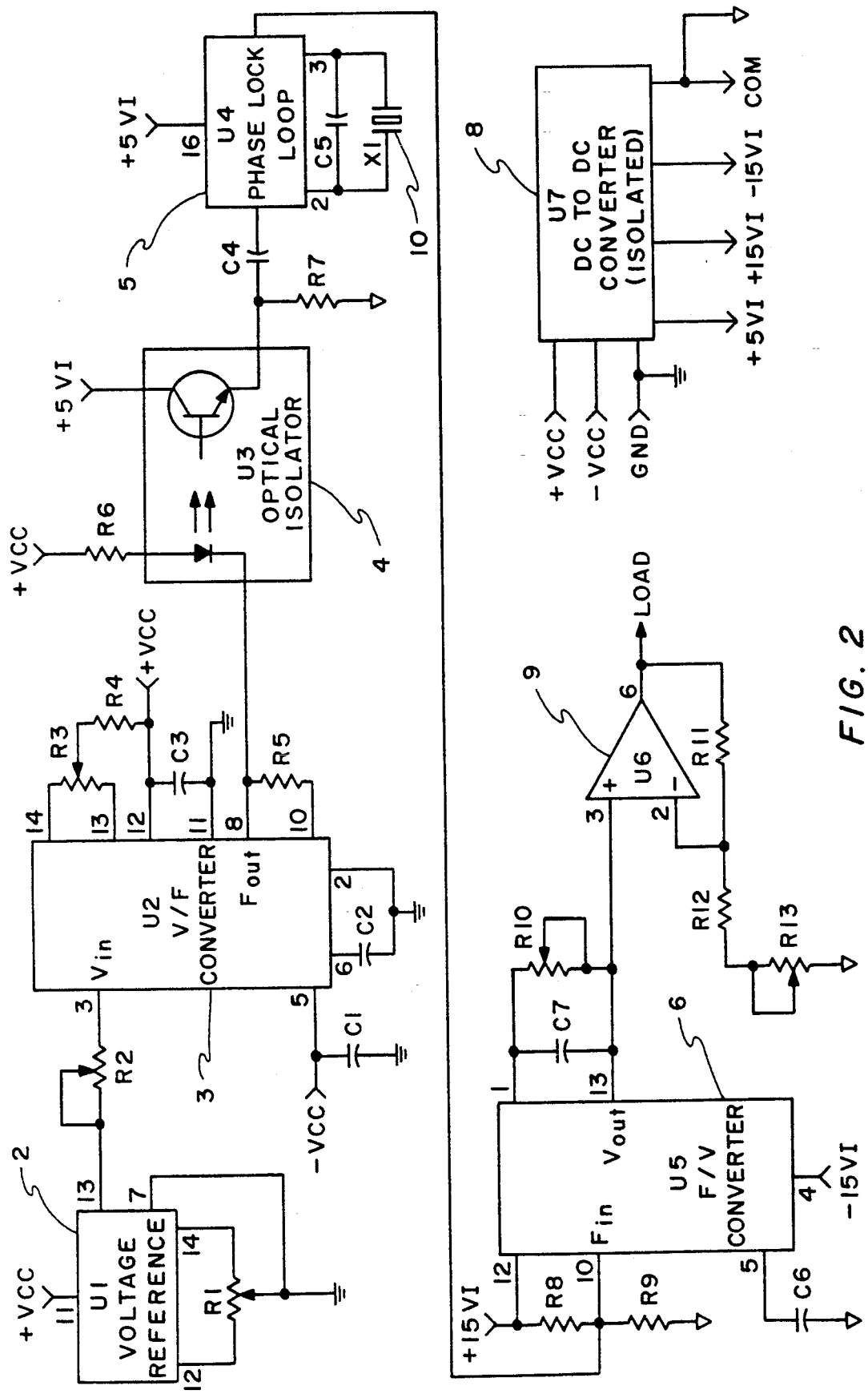
FIG. 2 displays the major components inherent to the system.

FIG. 2 is an electric schematic of the subject apparatus.

The embodiments of the invention in which an exclusive property or privilege is claimed are defined as follows:

1. An apparatus for providing an optically coupled, ultra-high precision, isolated reference voltage comprising:
   means for providing an unregulated voltage source;
   a precision voltage reference means for generating a voltage output in a set range where said precision voltage reference means is coupled to said unregulated voltage means;
   means for converting said voltage output from said precision voltage reference to a pulse rate frequency modulated signal;
   an optical isolator means for converting said pulse rate frequency modulated signal to an optical signal which is then transformed back to a second pulse rate frequency modulated signal and where said optical isolator is coupled to said voltage converting means;
   means for synchronizing said second pulse rate frequency modulated signal with a reference signal from said synchronization means where said synchronization means is coupled to said optical isolator;
   means for demodulating said frequency modulated signal and converting said demodulated signal to a voltage signal where said demodulating means is coupled to said synchronizing means;
   a driver amplifier coupled to said demodulating means;
   an isolated power supply where said isolated power supply is coupled to said demodulating means, said synchronization means, and said driver amplifier; and
   means for controlling the environment of the apparatus minus said unregulated voltage means.

2. The apparatus of claim 1 where said synchronization means is a crystal controlled phase-locked loop.

3. The apparatus of claim 1 where said driver amplifier isolates the demodulation means from a circuit load.

4. The apparatus of claim 3 where said driver amplifier provides a required load current to said circuit load.

5. The apparatus of claim 4 where said driver amplifier provides a precision voltage attenuation to said circuit load to simulate various battery cell voltages.

6. The apparatus of claim 1 where said precision voltage reference compensates for internal temperature variations to limit the effects of temperature variation.

7. The apparatus of claim 2 where said optical isolator functions to decouple said frequency modulated signal from an imposed instrument ground.

8. The apparatus of claim 2 where said crystal controlled phase-locked loop employs a crystal oscillator for generating said reference signal used in synchronizing said second pulse rate frequency modulated signal.

9. The apparatus of claim 1 where said environmental controlling means provides for temperature control of the apparatus minus said unregulated voltage source.

10. The apparatus of claim 1 where said voltage output is 10.000 V±1.0 mV.

11. A system for providing an optically coupled, ultra-high precision, isolated reference voltage comprising:
    means for providing an voltage signal from an unregulated voltage source;
    means for acting on said voltage signal through the use of a precision voltage reference to provide a noise suppressed signal where said precision voltage reference is coupled to said unregulated voltage means;
    means for converting said noise suppressed signal from said precision voltage reference to a pulse rate frequency modulated signal;
    an optical isolator means for converting said pulse rate frequency modulated signal to an optical signal which is then transformed back to a second pulse rate frequency modulated signal and where said optical isolator is coupled to said voltage converting means;
    means for synchronizing said second pulse rate frequency modulated signal with an internally generated signal where said synchronization means is coupled to said optical isolator;
    means for demodulating said frequency modulated signal and converting said demodulated signal to a voltage signal where said demodulating means is coupled to said synchronizing means;
    a driver amplifier coupled to said demodulating means;
    an isolated power supply where said isolated power supply is coupled to said demodulating means, said synchronization means, and said driver amplifier; and
    means for controlling the environment of the apparatus minus said unregulated voltage means.

12. The system of claim 10 where said environmental controlling means regulates the temperature of the system less the unregulated voltage source.

13. The system of claim 10 in which said synchronization means employs a crystal oscillator to produce said internally generated signal for synchronizing said second pulse rate frequency modulated signal.

14. The system of claim 10 where said driver amplifier isolates said demodulation means from a circuit load.

15. The system of claim 10 where said driver amplifier provides a required load current to said circuit load.

16. The system of claim 14 where said driver amplifier provides a precision voltage attenuation to said circuit load to simulate various battery cell voltages.

17. The apparatus of claim 10 where said optical isolator functions to decouple said frequency modulated signal from an imposed instrument ground.

* * * * *